(12) United States Patent  
Lin et al.

(10) Patent No.: US 9,281,288 B2  
(45) Date of Patent: Mar. 8, 2016

(54) SYSTEM AND METHOD FOR FINE PITCH POP STRUCTURE

(71) Applicant: Taiwan Semiconductor Manufacturing Company, Ltd., Hsin-Chu (TW)

(72) Inventors: Cheng-Chung Lin, Taipei (TW); Hsiu-Jen Lin, Zhubei (TW); Cheng-Ting Chen, Taichung (TW); Chun-Cheng Lin, New Taipei (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/175,668

(22) Filed: Feb. 7, 2014

(65) Prior Publication Data

US 2014/0151878 A1    Jun. 5, 2014

Related U.S. Application Data

(62) Division of application No. 13/399,437, filed on Feb. 17, 2012, now Pat. No. 8,674,496.

(51) Int. Cl.
*H01L 23/00* (2006.01)
*H01L 23/498* (2006.01)
*H01L 25/10* (2006.01)
*H01L 25/00* (2006.01)
*H01L 23/538* (2006.01)

(52) U.S. Cl.
CPC .......... *H01L 24/14* (2013.01); *H01L 23/49816* (2013.01); *H01L 25/105* (2013.01); *H01L 25/50* (2013.01);

(Continued)

(58) Field of Classification Search
CPC .................. H01L 2924/00; H01L 2924/00014; H01L 2224/73265; H01L 2224/48227; H01L 2224/32225; H01L 24/49; H01L 23/00; H01L 24/14
USPC .............. 257/690, 778, E23.01, E21.511, 737
See application file for complete search history.

(56) References Cited

U.S. PATENT DOCUMENTS

2006/0079079 A1\*   4/2006   Muthukumar et al. ....... 438/618  
2008/0185705 A1\*   8/2008   Osborn et al. ................ 257/690

(Continued)

FOREIGN PATENT DOCUMENTS

| JP | 01161842 | 6/1989 |
|----|----------|--------|
| JP | 07249632 | 9/1995 |
| JP | 2011035155 | 2/2011 |

OTHER PUBLICATIONS

Xu, H., et al., "Manufacture of Hourglass-shaped Solder Joint by Induction Heating Reflow," International Conference on Electronic Packaging Technology & High Density Packaging, 2008, 5 pages, IEEE.

*Primary Examiner* — Chuong A Luu  
*Assistant Examiner* — Rodolfo Fortich  
(74) *Attorney, Agent, or Firm* — Slater & Matsil, L.L.P.

(57) ABSTRACT

A fine pitch package-on-package (PoP), and a method of forming, are provided. The PoP may be formed by placing connections, e.g., solder balls, on a first substrate having a semiconductor die attached thereto. A first reflow process is performed to elongate the solder balls. Thereafter, a second substrate having another semiconductor die attached thereto is connected to the solder balls. A second reflow process is performed to form an hourglass connection.

20 Claims, 3 Drawing Sheets

(52) U.S. Cl.
CPC ... *H01L 23/5389* (2013.01); *H01L 2224/16225* (2013.01); *H01L 2225/1023* (2013.01); *H01L 2225/1058* (2013.01); *H01L2924/01322* (2013.01); *H01L 2924/15311* (2013.01); *H01L 2924/15331* (2013.01); *H01L 2924/15787* (2013.01); *H01L 2924/181* (2013.01); *H01L 2924/18161* (2013.01)

(56) References Cited

U.S. PATENT DOCUMENTS

2009/0188704 A1    7/2009   Lee et al.
2012/0025374 A1    2/2012   Bae et al.

\* cited by examiner

SYSTEM AND METHOD FOR FINE PITCH POP STRUCTURE

This application is a divisional application of, and claims priority to, U.S. patent application Ser. No. 13/399,437, entitled "System and Method for Fine Pitch PoP Structure," filed on Feb. 17, 2012, which application is incorporated herein by reference

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

Another 3D package utilized packaging-on-packaging (PoP) or interposer techniques for stacking dies to reduce form factor. PoP includes a first die electrically coupled to a silicon interposer, with another packaged die placed over the first die and electrically coupled to the silicon interposer. The silicon interposer is then electrically coupled to another substrate, such as a printed circuit board.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Figure 1:
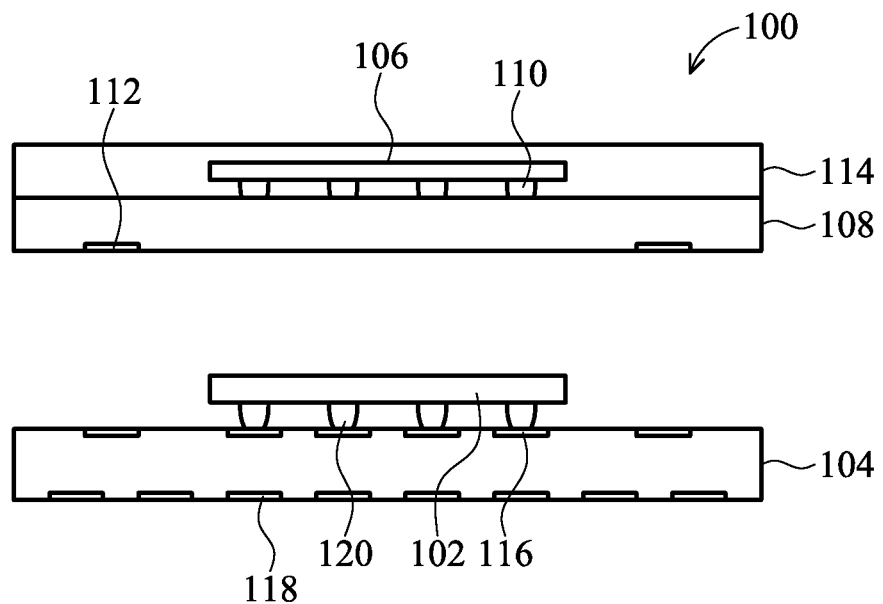
FIGS. 1-5 illustrate various intermediate stages of forming an embodiment.

Referring first to FIG. 1, there is shown a cross-section view of a first substrate 108 and a second substrate 104 in accordance with an embodiment. In an embodiment, the first substrate 108 is a component of a package 100, which may include, for example, a first integrated circuit die 106 mounted on the first substrate 108 via a first set of conductive connections 110. The first set of conductive connections 110 may comprise, for example, lead free solder, eutectic lead, conductive pillars, combinations thereof, and/or the like.

The first substrate 108 may be, for example, a packaging substrate, a printed-circuit board, a high-density interconnect, or the like. Through vias (TVs) (not shown) may be used to provide electrical connections between the first integrated circuit die 106 and a first set of conductive features 112 on an opposing surface of the first substrate 108. The first substrate 108 may also include redistribution lines (RDLs) (not shown) within and/or on one or both surfaces of the first substrate 108 to allow for a different pin configuration as well as larger electrical connections. An encapsulant or overmold 114 may also be formed over the components to protect the components from the environment and external contaminants.

The second substrate 104 may further have a second integrated circuit die 102 mounted thereon, in accordance with an embodiment. As will be discussed in greater detail below, the package 100 will be electrically coupled to the second substrate 104, thereby creating a Package-on-Package (PoP).

The second substrate 104 further includes a second set of conductive features 116 on a same surface of the second substrate 104 upon which the second integrated circuit die 102 is mounted and a third set of conductive features 118 along an opposing surface of the second substrate 104 from the second integrated circuit die 102. In this embodiment, the second substrate 104 provides an electrical connection between the first integrated circuit die 106 and the second integrated circuit die 102, and/or between the third set of conductive features 118 of the second substrate 104 and one or both of the first integrated circuit die 106 and the second integrated circuit die 102 via a subsequently formed set of conductive connections (see FIG. 5). TVs (not shown) in the second substrate 104 provide an electrical connection between the second set of conductive features 116 and the third set of conductive features 118. The second substrate 104 may also include RDLs (not shown) within and/or on one or both surfaces of the second substrate 104 to allow for a different pin configuration as well as larger electrical connections. In an embodiment, the second substrate 104 may be any suitable substrate, such as a silicon substrate, an organic substrate, a ceramic substrate, a dielectric substrate, a laminate substrate, or the like.

As illustrated in FIG. 1, the second integrated circuit die 102 is electrically coupled to some of the conductive features of the second set of conductive features 116 on the second substrate 104 via a second set of conductive connections 120. The second set of conductive connections 120 may comprise, for example, lead free solder, eutectic lead, conductive pillars, combinations thereof, and/or the like.

The second integrated circuit die 102 and the first integrated circuit die 106 may be any suitable integrated circuit die for a particular application. For example, one of the second integrated circuit die 102 and the first integrated circuit die 106 may be a memory chip, such as a DRAM, SRAM, NVRAM, and/or the like, while the other die may be a logic circuit.

Figure 2:
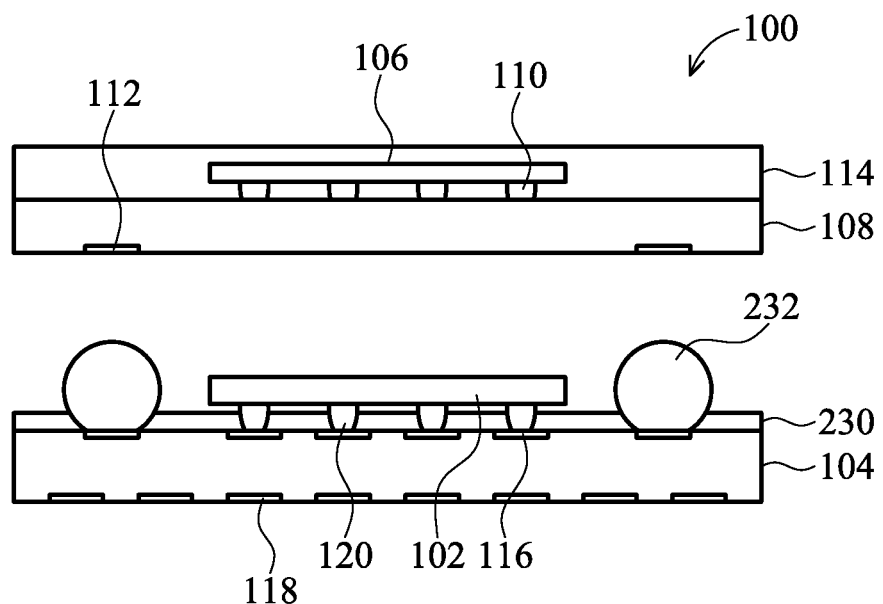

Referring now to FIG. 2, a flux 230 is applied to the surface of the second substrate 104 and third set of conductive connections 232 are applied in electrical contact to the second set of conductive features 116, in accordance with an embodiment. The flux 230 may be applied by, for example, in a dipping operation in which the surface of the second substrate 104 is dipped in a flux. The flux helps clean the surface of the second set of conductive features 116, thereby aiding in formation of an electrical contact between the second set of conductive features 116 and the third set of conductive connections 232.

In an embodiment the third set of conductive connections 232 comprise an interior core having a softer exterior surface. For example, the third set of conductive connections 232 may be a Cu core or plastic core solder ball. In this embodiment, the solder balls have a Cu core or a plastic core with a solder exterior, such as a eutectic solder, lead free solder, or the like exterior. The solder exterior has a lower melting temperature than the interior core such that the interior core may retain its shape while the exterior shape may be reformed during a subsequent reflow process.

Figure 3:
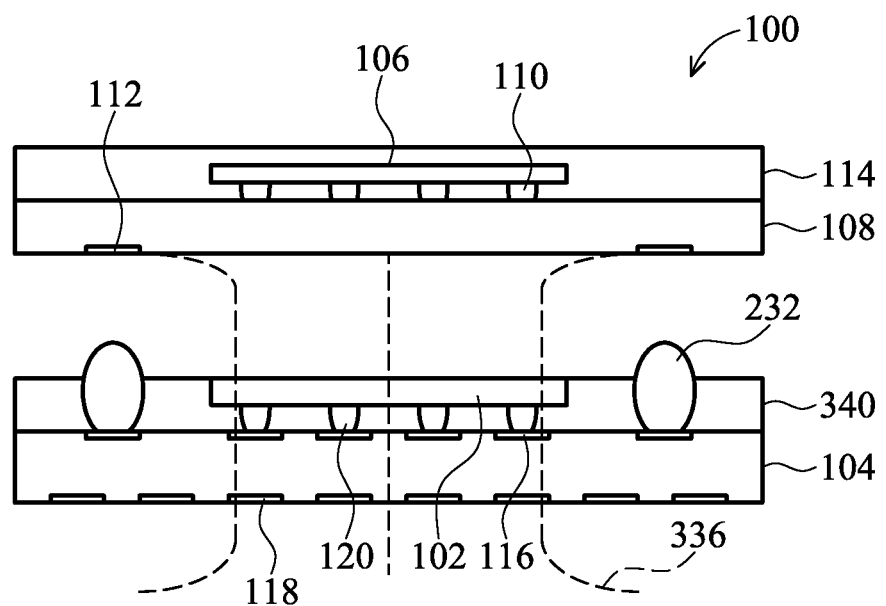

FIG. 3 illustrates the third set of conductive connections 232 after a first reflow process in accordance with an embodiment. As illustrated in FIGS. 2 and 3, the first reflow process results in transforming the third set of conductive connections 232 from a relative ball shape in FIG. 2 to a bullet shape in FIG. 3. In an embodiment, the first reflow process is performed using an induction reflow process. The induction reflow process may be performed such that the magnetic field (represented by dotted lines 336 in FIG. 3) is perpendicular to the major surface of the second substrate 104. Performing the induction reflow process in this manner will help elongate the third set of conductive connections 232 (such as the solder exterior of the connector). The current used during the induction reflow process may be adjusted to achieve the desired shape for a particular application. In other embodiments, however, other reflow processes, such as rapid thermal processing (RTP), infra-red (IR), and the like may also be used.

FIG. 3 further illustrates formation of a molding compound 340 applied on the second substrate 104 in accordance with an embodiment. In an embodiment, the molding compound 340 is a molding underfill (MUF) comprising, for example, a polymer, epoxy, and/or the like. The molding compound 340 may be in contact with the top surface and the edges of the second integrated circuit die 102. The molding compound 340 may be molded onto the second integrated circuit die 102 and the second substrate 104 using, for example, compressive molding or transfer molding. The embodiment illustrated in FIG. 3 has a top surface of the molding compound 340 coplanar with a top surface of the second integrated circuit die 102. In other embodiments, a top surface of the molding compound 340 may be higher than a top surface of the second integrated circuit die 102 such that the second integrated circuit die 102 may be fully encapsulated in the molding compound 340. Optionally, a grinding or polishing process may be performed to remove portions of the molding compound 340 from over a top surface of the second integrated circuit die 102 to expose the second integrated circuit die 102.

Figure 4:
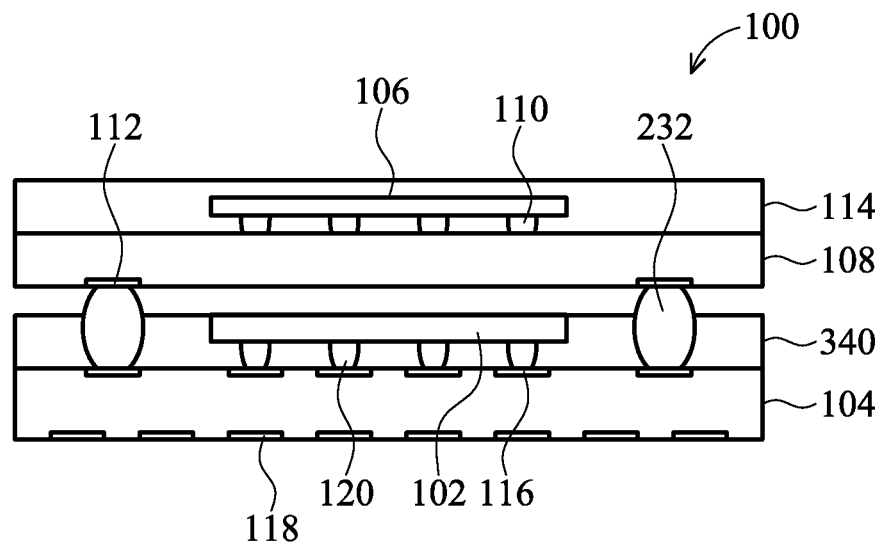

FIG. 4 illustrates the package 100 after an initial bonding step to bring the first set of conductive features 112 of the first substrate 108 into contact with the third set of conductive connections 232 (e.g., the solder balls) in accordance with an embodiment. A flux (not shown in FIG. 4) may also be used to clean the surfaces of the first set of conductive features 112 of the first substrate 108 and/or the third set of conductive connections 232, aiding in formation of an electrical connection.

Figure 5:
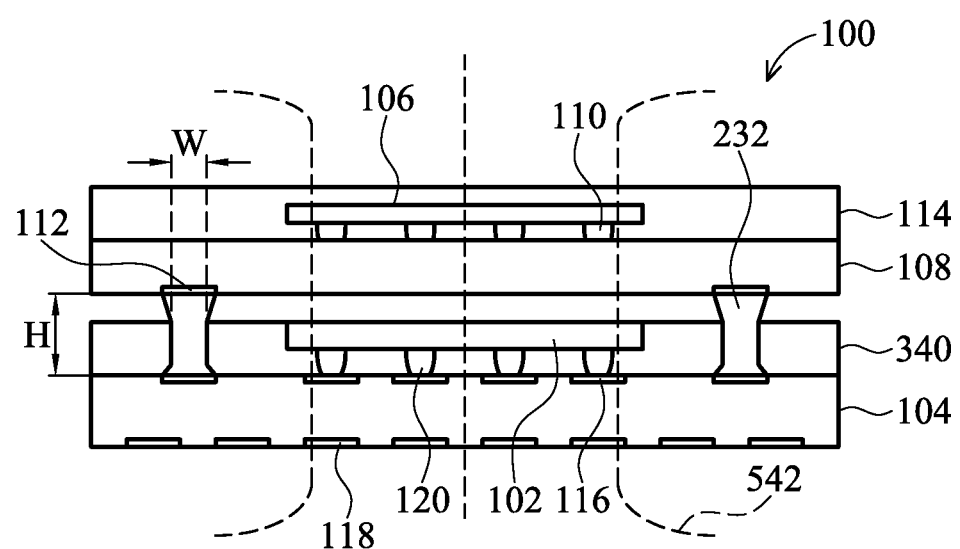

FIG. 5 illustrates a shape of the third set of conductive connections 232 after a second reflow process has been performed in accordance with an embodiment. As illustrated in FIG. 5, the second reflow process results in the third set of conductive connections 232 obtaining an hourglass shape. In an embodiment, the second reflow process is performed using an induction reflow process such that the magnetic field (represented by dotted lines 542 in FIG. 5) is perpendicular to the major surface of the second substrate 104. Performing the induction reflow process in this manner will help elongate the third set of conductive connections 232 (such as the solder exterior of the connector). Elongating the exterior portions of the third set of conductive connections 232 helps create the hourglass shape as illustrated in FIG. 5. The current used during the induction reflow process may be adjusted to achieve the desired shape for a particular application. In other embodiments, however, other reflow processes, such as RTP, IR, and the like may also be used.

In an embodiment, individual ones of the third set of conductive connections 232 has a width W along a mid-section and a height H as illustrated in FIG. 5. In an embodiment, a ratio of H to W (H/W) is from about 1.0 to about 4.0. It has been found that forming connections such as these using the reflow processes discussed above to create a bullet shape and then an hourglass shape allows a higher density of connectors. For example, by utilizing relatively long and narrow connections, the connections may be high enough to accommodate PoP configurations as illustrated in FIG. 5, yet still have a high density to accommodate the shrinking trends of semiconductor devices in the industry. The use of an hourglass shape also reduces the likelihood of adjacent connectors shorting together.

It should be understood that the above description provides a general description of embodiments and that embodiments may include numerous other features. For example, embodiments may include under bump metallization layers, passivation layers, molding compounds, additional dies and/or substrates, and the like. Additionally, the structure, placement, and positioning of the first integrated circuit die 106 and the second integrated circuit die 102 are provided for illustrative purposes only, and accordingly, other embodiments may utilize different structures, placements, and positions.

It should also be understood that the ordering of the various steps discussed above are provided for illustrative purposes only, and as such, other embodiments may utilize different sequences. These various orderings of the step are to be included within the scope of embodiments.

In an embodiment, the first set of conductive features 112 on the first substrate 108 and the second and third set of conductive features 116 and 118 on the second substrate 104 may be arranged in a ball grid array (BGA) arrangement.

Thereafter, other normal processes may be used to complete the package 100. For example, the second substrate 104 may be attached to yet another substrate, such as a printed circuit board (PCB), a high-density interconnect, a silicon substrate, an organic substrate, a ceramic substrate, a dielectric substrate, a laminate substrate, another semiconductor package, or the like.

In an embodiment, a semiconductor device is provided. The semiconductor device comprises a first substrate having a first semiconductor die coupled thereto, a second substrate having a second semiconductor die coupled thereto, and a plurality of electrical connections electrically coupling the first substrate to the second substrate. Each of the plurality of electrical connections has a height to width ratio of between about 1 to about 4.

In another embodiment, a semiconductor device is provided. The semiconductor device comprises a first substrate having a first semiconductor die coupled thereto, a second substrate having a second semiconductor die coupled thereto, and a plurality of electrical connections electrically coupling the first substrate to the second substrate. Each of the plurality of electrical connections has an hourglass shape.

In yet another embodiment, a method of forming a semiconductor device is provided. The method comprises providing a first substrate having a first semiconductor die attached thereto; providing a second substrate having a second semiconductor die attached thereto; placing a plurality of electrical connections on the first substrate; performing a first reflow process to elongate the plurality of electrical connections; contacting the second substrate to the plurality of electrical connections; and performing a second reflow process, forming each of the plurality of electrical connections into a shape have a wider portion in a middle region as compared to regions contacting the first substrate and the second substrate.

Although the present disclosure and its advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
   a first substrate comprising redistribution lines, the first substrate having a first semiconductor die coupled thereto via a first set of conductive connections comprising solder;
   a second substrate comprising redistribution lines, the second substrate having a second semiconductor die coupled thereto via a second set of conductive connections comprising solder; and
   a plurality of elongated electrical connections electrically coupling the first substrate to the second substrate, each of the elongated electrical connections having a height-to-width ratio from 1 to about 4.

2. The semiconductor device of claim 1, wherein each of the electrical connections have a width smaller in a middle region than regions adjacent the first substrate and the second substrate.

3. The semiconductor device of claim 1, wherein each of the electrical connections has an interior core different from an exterior portion.

4. The semiconductor device of claim 3, wherein the exterior portion has a lower melting temperature than the interior core.

5. The semiconductor device of claim 3, wherein the interior core comprises a Cu core.

6. The semiconductor device of claim 3, wherein the interior core comprises a plastic core.

7. The semiconductor device of claim 1, further comprising a molding underfill positioned between the first substrate and the second substrate.

8. A semiconductor device comprising:
   a first substrate comprising redistribution lines, the first substrate having a first semiconductor die coupled thereto via a first set of conductive connections comprising solder;
   a second substrate comprising redistribution lines, the second substrate having a second semiconductor die coupled thereto via a second set of conductive connections comprising solder; and
   a plurality of elongated electrical connections electrically coupling the first substrate to the second substrate, each of the elongated electrical connections having an hourglass shape, wherein each of the elongated electrical connections has an interior core different from an exterior portion, the exterior portion contacting the first substrate and the second substrate, the exterior portion comprising solder.

9. The semiconductor device of claim 8, further comprising a molding underfill interposed between the first substrate and the second substrate.

10. The semiconductor device of claim 8, wherein each of the electrical connections having a height-to-width ratio from 1 to about 4.

11. The semiconductor device of claim 8, wherein the exterior portion has a lower melting temperature than the interior core.

12. The semiconductor device of claim 8, wherein the interior core comprises a Cu core.

13. The semiconductor device of claim 8, wherein the interior core comprises a plastic core.

14. A semiconductor device comprising:
   a first substrate comprising redistribution lines, the first substrate having a first semiconductor die coupled thereto via a first set of conductive connections comprising solder;
   a second substrate comprising redistribution lines, the second substrate having a second semiconductor die coupled thereto via a second set of conductive connections comprising solder;
   a molding compound interposed between the first substrate and the second substrate; and
   a plurality of elongated electrical connections electrically coupling the first substrate to the second substrate, each of the elongated electrical connections having a first region and a second region along the first substrate and the second substrate, respectively, the first region and the second region being wider than an intermediate region interposed between the first region and the second region, the intermediate region adjoining the molding compound at a narrowest portion of the intermediate region.

15. The semiconductor device of claim 14, wherein each of the electrical connections has an interior core different from an exterior portion.

16. The semiconductor device of claim 15, wherein the interior core comprises a Cu core.

17. The semiconductor device of claim 15, wherein the interior core comprises a plastic core.

18. The semiconductor device of claim 15, wherein the interior core has a different melting temperature than the exterior portion.

19. The semiconductor device of claim 14, wherein each of the plurality of electrical connections has a height-to-width ratio from 1 to about 4.

20. The semiconductor device of claim 15, wherein the exterior portion comprises solder.

* * * * *